(12) United States Patent
Ohmi et al.

(10) Patent No.: US 8,198,195 B2
(45) Date of Patent: Jun. 12, 2012

(54) PLASMA PROCESSING METHOD AND PLASMA PROCESSING APPARATUS

(75) Inventors: Tadahiro Ohmi, Miyagi (JP); Akinobu Teramoto, Miyagi (JP)

(73) Assignee: Tadahiro Ohmi, Sendai-Shi (JP)

( * ) Notice: Subject to any disclaimer, the term of this patent is extended or adjusted under 35 U.S.C. 154(b) by 1066 days.

(21) Appl. No.: 11/992,540

(22) PCT Filed: Sep. 26, 2005

(86) PCT No.: PCT/JP2005/017600
§ 371 (c)(1),
(2), (4) Date: Mar. 25, 2008

(87) PCT Pub. No.: WO2007/034559
PCT Pub. Date: Mar. 29, 2007

(65) Prior Publication Data
US 2009/0134120 A1    May 28, 2009

(51) Int. Cl.
*H01L 21/302* (2006.01)
*H01L 21/461* (2006.01)
(52) U.S. Cl. ........ 438/706; 438/707; 438/708; 438/709; 438/710; 438/714
(58) Field of Classification Search .................. None
See application file for complete search history.

(56) References Cited

U.S. PATENT DOCUMENTS

| | | | |
|---|---|---|---|
| 6,090,722 A | 7/2000 | Armacost et al. | |
| 6,357,385 B1 | 3/2002 | Ohmi et al. | |
| 6,479,390 B1 | 11/2002 | Lee | |
| 2004/0102052 A1 | 5/2004 | Ohmi et al. | |
| 2004/0108575 A1* | 6/2004 | Ohmi et al. | 257/627 |
| 2006/0110934 A1* | 5/2006 | Fukuchi | 438/778 |

FOREIGN PATENT DOCUMENTS

| | | |
|---|---|---|
| CN | 1592957 | 3/2005 |
| JP | 10-074600 | 3/1998 |
| JP | 2000-208499 A | 7/2000 |
| JP | 2001-68460 A | 3/2001 |
| JP | 2002-261091 A | 9/2002 |
| JP | 2003-073835 A | 3/2003 |
| JP | 2003-282565 A | 10/2003 |
| JP | 2004-47580 A | 2/2004 |
| JP | 2005-123389 A | 5/2005 |
| WO | WO 98/33362 A1 | 7/1998 |
| WO | WO 2004/073025 A2 | 8/2004 |

OTHER PUBLICATIONS

Derwent 2005-319059, Ishihara et al.*
Chinese Patent Office; Office Action dated Mar. 31, 2010; pp. 1-7.

* cited by examiner

*Primary Examiner* — Duy Deo
(74) *Attorney, Agent, or Firm* — Foley & Lardner LLP

(57) ABSTRACT

A plasma processing apparatus in which consumption of expensive krypton and xenon gases is suppressed as much as possible while reducing damage on a workpiece during plasma processing. In plasma processing of a substrate using a rare gas, two or more kinds of different rare gases are employed, and an inexpensive argon gas is used as one rare gas and any one or both of krypton and xenon gases having a larger collision cross-sectional area against electron than that of the argon gas is used as the other gas. Consequently, consumption of expensive krypton and xenon gases is suppressed as much as possible and damage on a workpiece is reduced during plasma processing.

8 Claims, 8 Drawing Sheets

PLASMA PROCESSING METHOD AND PLASMA PROCESSING APPARATUS

This application is the National Phase of PCT/JP2005/017600, filed Sep. 26, 2005, the disclosure of which is hereby incorporated by reference in its entirety.

TECHNICAL FIELD

This invention relates to a method of plasma-processing a substrate or workpiece of an electronic device, such as a semiconductor-element or semiconductor-chip mounting substrate, a wiring substrate, or a flat panel display substrate, a processing apparatus therefor, and a manufacturing method for manufacturing an electronic device by such plasma processing.

BACKGROUND ART

Conventionally, a plasma is generated using a single rare gas in plasma processing for oxidizing, nitriding, or oxynitriding the surface of a workpiece such as a silicon semiconductor, forming an oxide film, a nitride film, an oxynitride film, a polysilicon film, an organic EL film, or the like on the surface of a workpiece, or etching the surface of a workpiece by the use of a plasma. As the rare gas, use is made of a krypton (Kr) gas or a xenon (Xe) gas with a large electron-collision cross-sectional area and a low plasma electron temperature for reducing plasma damage on the workpiece (see, e.g. Patent Document 1).

Patent Document 1 discloses an apparatus using Kr as a plasma excitation gas for forming an oxide film and a nitride film. This apparatus has a structure in which a coaxial waveguide, a radial line slot antenna, and microwave introducing windows are provided at an upper portion of a vacuum container serving as a process chamber in the order named from the outer side, a shower plate is provided inside the vacuum container, and a stage with a heating mechanism for placing a workpiece thereon is disposed under the shower plate. In a plasma processing method, the inside of the vacuum container is evacuated, an Ar gas is introduced from the shower plate, then the Ar gas is switched to a Kr gas and the pressure is set to 133 Pa. Then, a silicon substrate (workpiece) having been subjected to dilute hydrofluoric acid cleaning is introduced into the process chamber and placed on the stage and then the workpiece is heated so as to be maintained at 400° C. A microwave is supplied to the radial slot antenna from the coaxial waveguide, for example, for 1 minute, thereby introducing the microwave into the process chamber through the dielectric plates (the microwave introducing windows and the shower plate). In this manner, by exposing the surface of the silicon substrate to a high-density Kr plasma generated in the process chamber, surface-terminating hydrogen is removed. Then, while maintaining the pressure in the process chamber at about 133 Pa, a $Kr/O_2$ mixed gas at a predetermined partial pressure ratio is introduced from the shower plate, thereby forming a silicon oxide film having a nano-order thickness on the surface of the silicon substrate. Then, after once stopping the supply of the microwave, stopping the introduction of the $O_2$ gas, and purging the inside of the process chamber with Kr, a $Kr/NH_3$ mixed gas is introduced from the shower plate and, while setting the pressure in the process chamber at about 133 Pa, the microwave is again supplied to generate a high-density plasma in the process chamber, thereby forming a silicon nitride film having a nano-order thickness on the surface of the silicon oxide film. Further, the introduction of the microwave power is stopped to finish the plasma excitation when the formation of the silicon nitride film is finished, and then the Ar gas is substituted for the $Kr/NH_3$ mixed gas, thereby finishing the oxidation-nitriding process. In this manner, a semiconductor integrated circuit device is manufactured using the above apparatus.

However, the existing amount of a Kr gas and a Xe gas in the natural world is small and thus they are expensive as compared with an Ar gas used in normal plasma processing, and therefore, it has been difficult to use them in the industry.

Patent Document 1: Japanese Unexamined Patent Application Publication (JP-A) No. 2002-261091

DISCLOSURE OF THE INVENTION

Problem to be Solved by the Invention

It is an object of this invention to suppress the consumption of expensive krypton and xenon gases as much as possible and to reduce damage on a workpiece during plasma processing.

Means for Solving the Problem

For accomplishing the above object, a plasma processing method and a plasma processing apparatus of this invention are characterized in that the electron temperature in a plasma is defined by a rare gas having a large electron-collision cross-sectional area while dilution of the gas is performed with a less expensive rare gas, thereby forming a gas in the plasma by these two or more kinds of rare gases.

That is, according to this invention, there is provided a plasma-processing method which comprises generating a plasma by the use of a rare gas; and processing a workpieces by the use of said plasma. In the method, the rare gas includes two or more kinds of different rare gases.

According to this invention, there is provided the above-mentioned plasma processing method, in which the different rare gases have electron-collision cross-sectional areas different from each other.

According to this invention, there is provided any one of the above-mentioned plasma processing methods, in which one of said two or more kinds of different rare gases is an argon gas while other gas is a gas having an electron-collision cross-sectional area larger than that of said argon gas.

According to this invention, there is provided any one of the above-mentioned plasma processing methods, in which one of said two or more kinds of different rare gases is an argon gas while other gas is at lease one of krypton and xenon.

According to this invention, there is provided any one of the above-mentioned plasma processing methods, in which the plasma is generated by microwave excitation.

According to this invention, there is provided any one of the above-mentioned plasma processing methods, in which the processing includes one of: oxidizing, nitriding, or oxynitriding of at least a portion of a surface of the workpiece; film forming on at least a portion of a surface of the workpiece; and etching of at least a portion of a surface of the workpiece.

According to this invention, there is provided any one of the above-mentioned plasma processing methods, in which the oxidizing, nitriding, or oxynitrizing at least a portion of a surface of the workpiece by the use of the plasma includes introducing a nitriding gas or an oxidizing gas into the plasma.

According to this invention, there is provided any one of the above-mentioned plasma processing methods, in which the film forming on at least a portion of a surface of the workpiece includes introducing a gas necessary to film forming into the plasma.

According to this invention, there is provided any one of the above-mentioned plasma processing methods, in which the film forming includes forming an insulating film.

According to this invention, there is provided any one of the above-mentioned plasma processing methods, which includes introducing a gas necessary for etching into the plasma and etching a selected portion or the whole of a surface of the workpiece.

According to this invention, there is provided any one of the above-mentioned plasma processing methods, in which the gas having the larger electron-collision cross-sectional area, of the two or more kinds of different rare gases, is introduced into a plasma excitation region. The gas having the smaller electron-collision cross-sectional area is introduced to the outside of the plasma excitation region.

According to this invention, there is provided any one of the above-mentioned plasma processing methods, which further comprises recovering a part or the whole of the rare gas for reuse is recovered.

Further, according to this invention, there is provided a method of manufacturing an electronic device such as a semiconductor device, a flat panel display device, a computer, or a portable telephone terminal, the method comprising a step of processing a workpiece by any one of the above-mentioned plasma processing methods.

According to this invention, there is provided a plasma processing apparatus in which two or more kinds of different rare gases are supplied into a plasma process chamber.

According to this invention, there is provided the above-mentioned plasma processing apparatus in which the rare gases have electron-collision cross-sectional areas different from each other.

According to this invention, there is provided any one of the above-mentioned plasma processing apparatuses, in which one of the rare gases is an argon gas and other gas is a gas having an electron-collision cross-sectional area larger than that of the argon gas.

According to this invention, there is provided any one of the above-mentioned plasma processing apparatuses, in which one of the rare gases is an argon gas and other gas is one or both of krypton and xenon.

According to this invention, there is provided any one of the above-mentioned plasma processing apparatuses, in which the plasma is generated by microwave excitation.

According to this invention, there is provided any one of the above-mentioned plasma processing apparatuses, in which the plasma processing chamber is supplied with a nitriding gas or an oxidizing gas in addition to the rare gases.

According to this invention, there is provided any one of the above-mentioned plasma processing apparatuses, in which the plasma processing chamber is supplied with a desired gas in addition to the rare gases to perform film formation on a workplace.

According to this invention, there is provided any one of the above-mentioned plasma processing apparatuses, in which the plasma processing chamber is supplied with a gas for use in etching at least a portion of a workpiece, in addition to the rare gases.

According to this invention, there is provided any one of the above-mentioned plasma processing apparatuses, which introduces the rare gas having the larger electron-collision cross-sectional area into a plasma excitation region; and also introduces the argon gas to the outside of the plasma excitation region.

According to this invention, there is provided any one of the above-mentioned plasma processing apparatuses, which further comprises a rare gas recovery apparatus.

Further, in this invention, there is provided a plasma processing method that recovers, regenerates, and uses the used rare gases, thereby making it possible to more efficiently use the expensive rare gases.

According to this invention, use is made of a gas in which an Ar gas is added to one or both of Xe and Kr, wherein the required ratio of Xe or/and Kr in the mixed gas changes depending on various conditions. In many cases, at least 20 vol % is required. When the ratio is about 40% or more, substantially no difference in effect is observed as compared with the case of 100%, and there is no problem when the ratio is 50% or more. Naturally, the ratio is less than 100%.

Effect of the Invention

According to this invention, since plasma generation is carried out using a gas in which an Ar gas is added to one or both of Kr and Xe, it is possible to reduce damage during plasma processing and to achieve a reduction in amount of use of expensive Kr and Xe gases.

Figure 1:
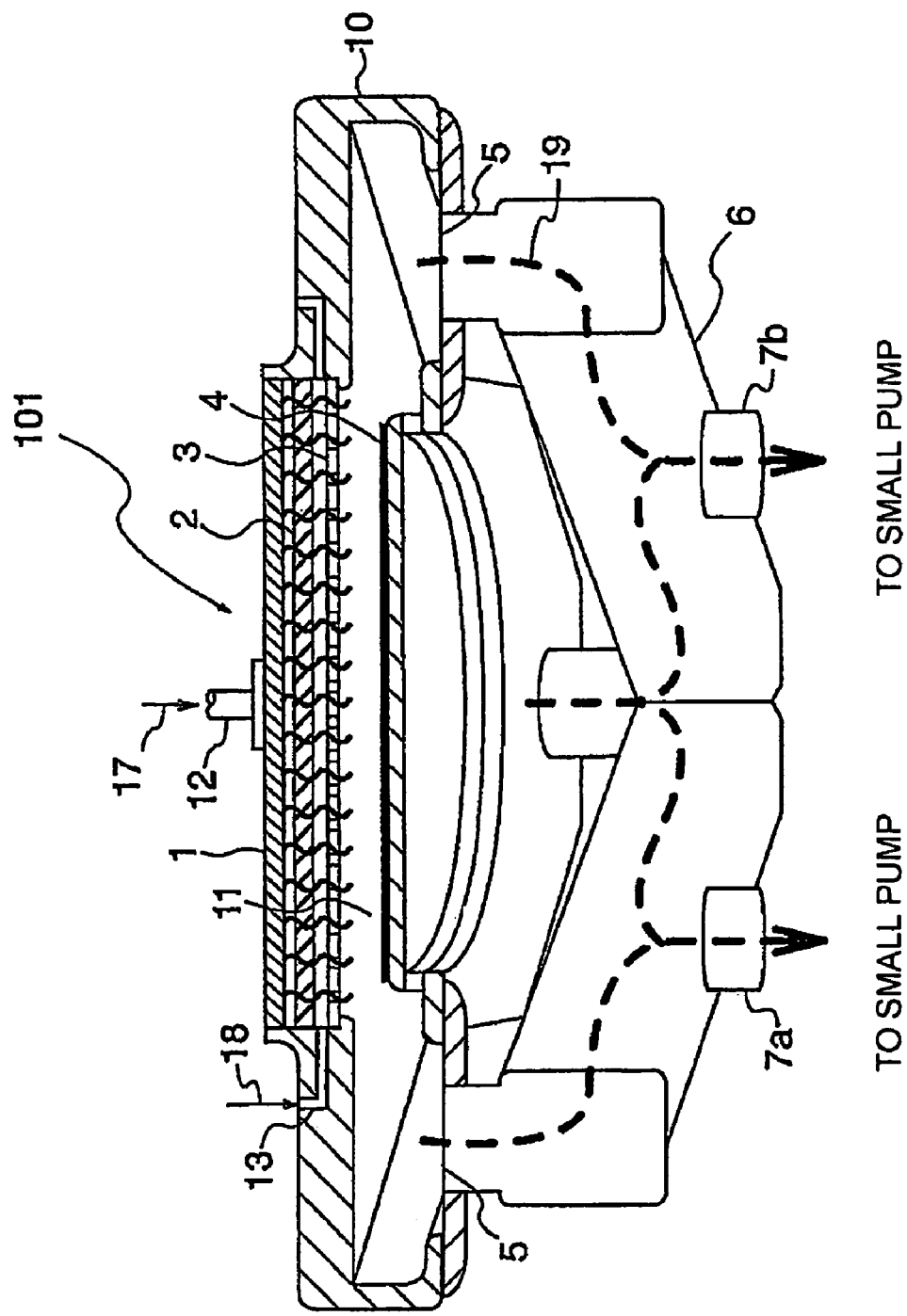
FIG. 1 is a sectional view of a microwave-excited plasma processing apparatus for use in an embodiment 1 of this invention.

DESCRIPTION OF SYMBOLS 1 antenna for microwave irradiation
2 insulator
3 shower plate
4 wafer
5 exhaust port 6 exhaust duct
7a, 7b small pump inlet pipe (exhaust pipe)
11 processing chamber
13 gas introducing pipe
15 attaching member
19 gas flow
21 upper shower plate
22 lower shower plate
25 RF bias power supply
101 microwave-excited plasma processing apparatus
101 dual shower plate microwave-excited plasma processing apparatus

BEST MODE FOR CARRYING OUT THE INVENTION

Hereinbelow, embodiments of this invention will be described with reference to the drawings.

First Embodiment

In the first embodiment of this invention, a description will be given of a mode in which plasma processing is a silicon direct oxidation/nitriding process.

Figure 2:
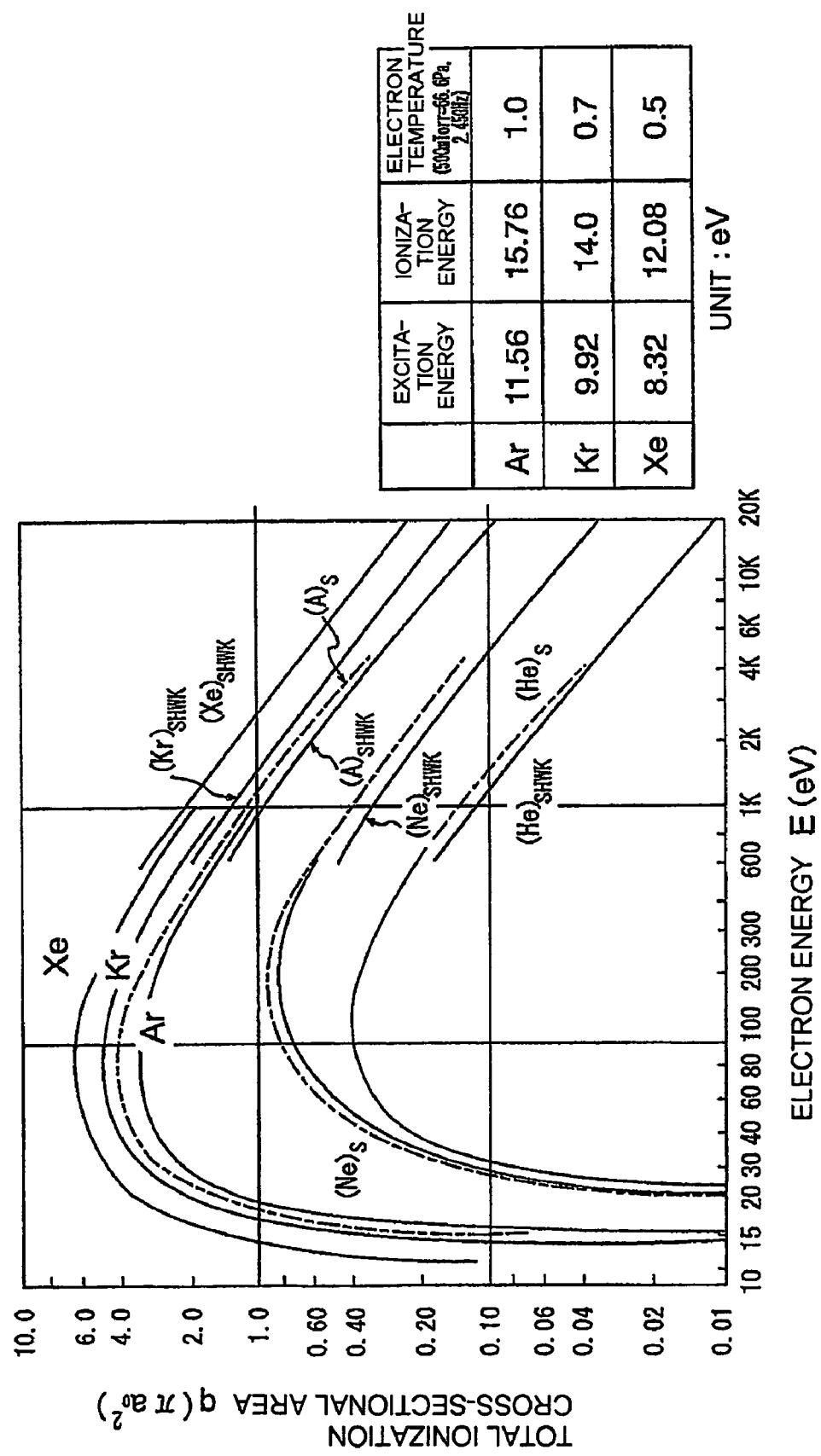
FIG. 2 includes an explanatory diagram showing electron temperatures and collision cross-sectional areas of respective rare gases and a diagram showing excitation energies, ionization energies, and electron temperatures of Ar, Kr, and Xe gases.
Figure 3:
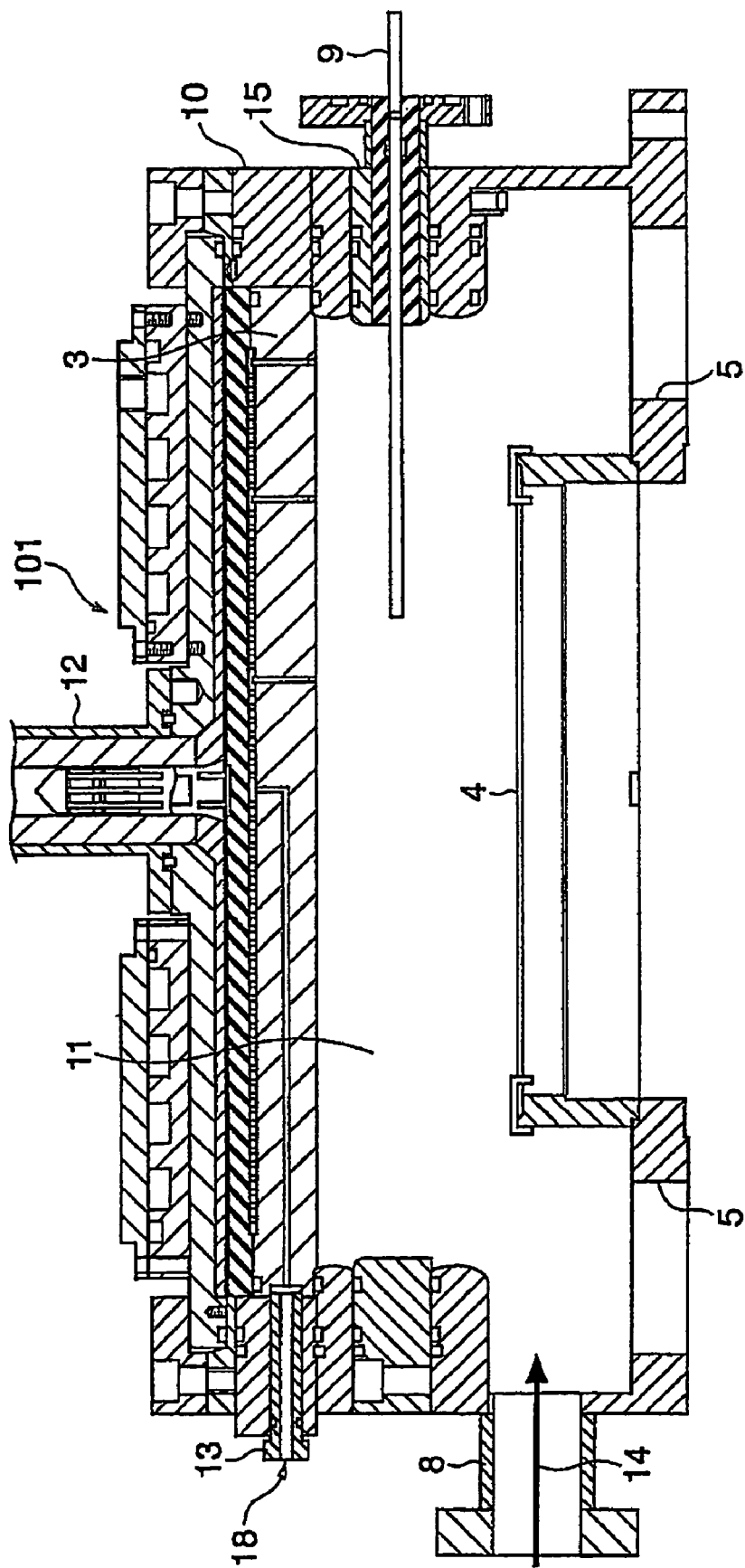
FIG. 3 is a sectional view showing a plasma measuring method.
Figure 4:
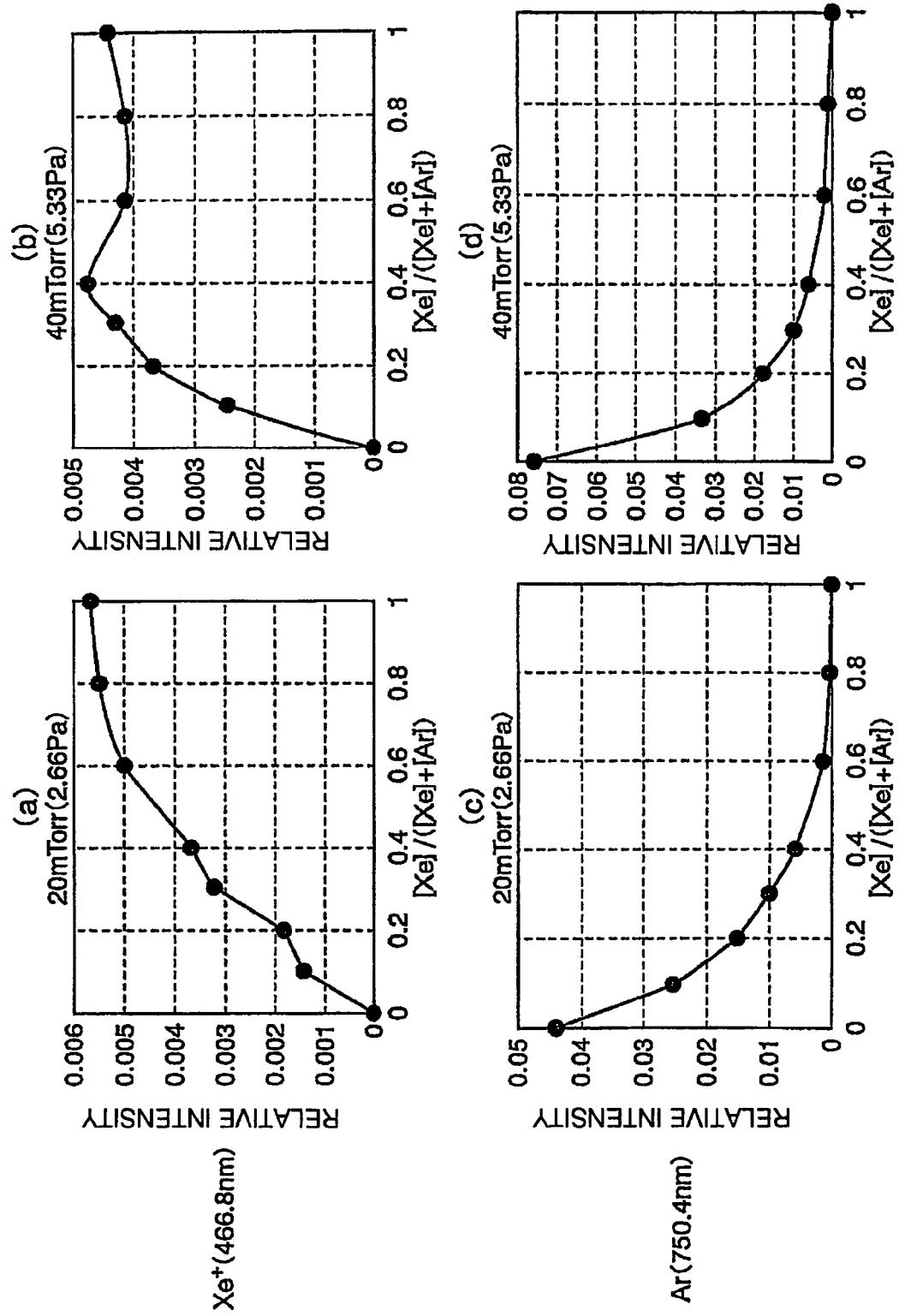
FIG. 4 shows luminous intensities of Ar/Xe mixed plasmas, wherein (a) shows relative intensities in the case of $Xe^+$ (466.8 nm) at 20 mTorr (2.66 Pa), (b) shows relative intensities in the case of $Xe^+$ (466.8 nm) at 40 mTorr (5.33 Pa), (c) shows relative intensities in the case of Ar (750.4 nm) at 20 mTorr (2.66 Pa), and (d) shows relative intensities in the case of Ar (750.4 nm) at 40 mTorr (5.33 Pa).
Figure 5:
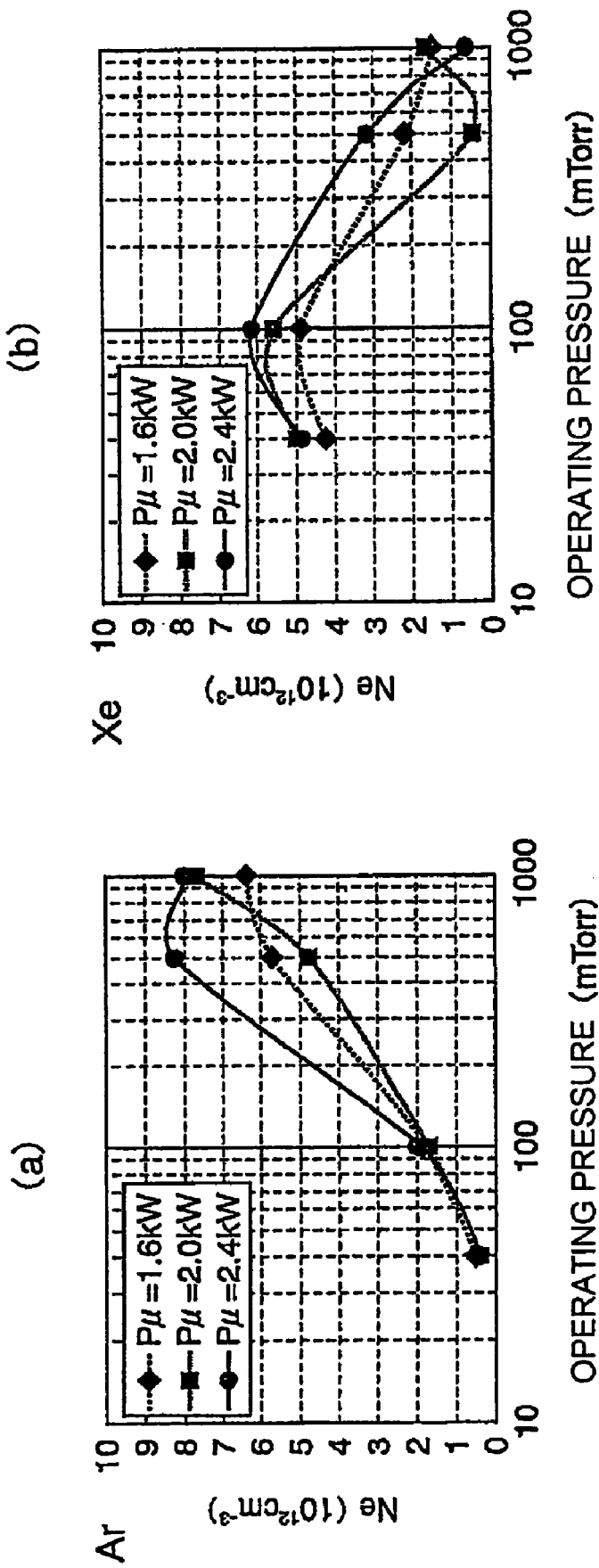
FIG. 5 shows plasma electron densities, wherein (a) shows the relationship between the operating pressure (mTorr=×0.133 Pa) and the number of electrons ($10^{12}$ cm$^{-3}$) of Ar and (b) shows the relationship between the operating pressure (mTorr=×0.133 Pa) and the number of electrons ($10^{12}$ cm$^{-3}$) of Xe.

FIG. 1 is a sectional view of a microwave-excited plasma processing apparatus. FIG. 2 is a diagram showing the relationship between the electron energy and the total ionization cross-sectional area. FIG. 3 is a sectional view showing a plasma measuring method. FIG. 4 are diagrams showing luminous intensities of Ar/Xe mixed plasmas, wherein (a) shows relative intensities in the case of $Xe^+$ (466.8 nm) at 2.66 Pa (20 mTorr), (b) shows relative intensities in the case of $Xe^+$ (466.8 nm) at 5.33 Pa (40 mTorr), (c) shows relative intensities in the case of Ar (750.4 nm) at 2.66 Pa (20 mTorr), and (d) shows relative intensities in the case of Ar (750.4 nm) at 5.33 Pa (40 mTorr). FIG. 5 are diagrams showing plasma electron densities, wherein (a) shows the relationship between the operating pressure (mTorr=×0.133 Pa) and the number of electrons ($10^{12}$ cm$^{-3}$) of Ar and (b) shows the relationship between the operating pressure (mTorr=×0.133 Pa) and the number of electrons ($10^{12}$ cm$^{-3}$) of Xe. FIG. 6(a), (b), (c), and (d) are diagrams showing electron densities, VSWRs, ion currents, and electron temperatures of Ar/Xe mixed plasmas, respectively. FIG. 7(a) is a diagram showing ion current densities when the ratio of Xe in an Ar/Xe mixed gas is changed from 0 to 1, and FIG. 7(b) is a diagram showing electron temperatures when the ratio of Xe in an Ar/Xe mixed gas (pressure) is changed in the same manner.

Referring to FIG. 1, a microwave is radiated into a plasma processing chamber 11 by an antenna 1 disposed at an upper portion of a plasma processing apparatus 101 through an insulator plate 2. An Ar gas, a Kr gas (or a Xe gas), and an oxygen gas (a $N_2/H_2$ or $NH_3$ gas in the case of a nitriding process or a mixed gas of an oxidizing gas and a nitriding gas, such as an $O_2/NH_3$, $O_2/N_2O$, or $O_2/NO$ gas, in the case of an oxynitriding process) are introduced into the apparatus inside 11 from a gas introducing pipe 13 through a shower plate 3, so that a plasma is excited above a workpiece 4 in the apparatus inside 11 by the microwave irradiated there as described above.

Referring back to FIG. 1, the silicon wafer 4 being a workpiece substrate is placed in the process chamber 11 at a place where the plasma is directly irradiated, and is oxidized by oxygen radicals etc. excited by the plasma. In this event, it is preferable that the workpiece 4 be placed in the process chamber 11 not in a space where the plasma is excited, but in a space where the plasma is diffused.

An exhaust gas in the process chamber 11 passes through exhaust ducts 6 via exhaust ports 5 so as to be conducted to non-illustrated small pumps through inlet tubes 7a and 7b for the respective small pumps as indicated by broken-line arrows 19.

For measuring the excited plasma, a probe 9 is provided so that its tip end is projected into the process chamber 11 as shown in FIG. 3. The probe 9 is fixed by an attaching member 15. Luminous measurement is carried out through a different window as indicated by an arrow 14.

Herein, as shown in FIG. 2, since the electron-collision cross-sectional area and the ionization energy of a Kr or Xe gas are both small where the electron temperature is low as compared with Ar, when a microwave is irradiated to a mixed gas of Ar and Kr (or Xe), Kr (or Xe) is selectively ionized to form a plasma so that the electron temperature of the plasma is defined by Kr (or Xe). Therefore, it is possible to suppress damage to a $SiO_2$ film ($Si_3N_4$ film, SiON film) during formation thereof or having been formed and to suppress the use of the expensive Kr (or Xe) gas.

Further, referring to FIG. 4(a), (b) and (c), (d), it is seen that the luminous intensity (relative intensity) of $Xe^+$ is greater at 40 mTorr (5.33 Pa) than at 20 mTorr (2.66 Pa), while, the luminous intensity of Ar does not depend on the pressure when the partial pressure (molar fraction) of Xe is 0.2 or more.

Further, referring to FIG. 5, it is seen that the electron density of Ar increases as the flow rate ratio (i.e. partial pressure) of Xe increases, while, the electron density of Xe decreases as the flow rate ratio increases.

Figure 6:
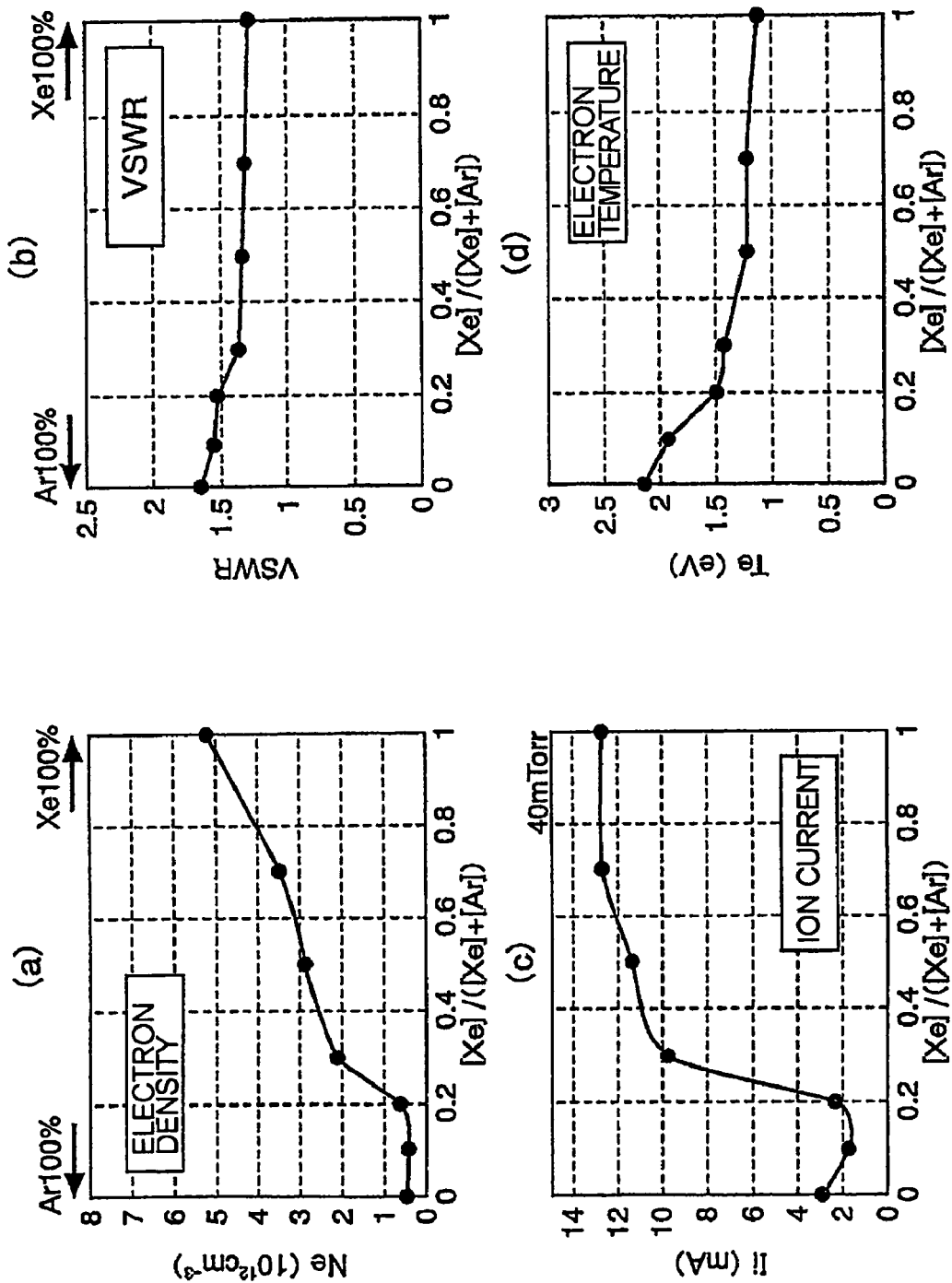
FIG. 6 includes diagrams (a), (b), (c), and (d) showing electron densities, VSWRs, ion currents, and electron temperatures of Ar/Xe mixed plasmas, respectively.

Further, referring to FIG. 6, the electron density increases from a Xe composition ratio of 20% and, thereafter, monotonously increases as the composition ratio increases, and VSWR monotonously slightly decreases as the Xe composition ratio increases. It is seen that the ion current abruptly increases at a Xe composition ratio of 20% and the electron temperature abruptly decreases until a Xe composition ratio of 20% and, thereafter, monotonously decreases as the composition ratio increases.

Further, referring to FIG. 7(a), it is seen that when a pressure of a mixed gas, which corresponds to the total flow rate, is 20 mTorr (2.66 Pa), the ion current density abruptly increases near a Xe flow rate ratio of 0.75. Further, it is seen that when the total flow rate is 40 mTorr (5.33 Pa), the ion current density abruptly increases when the Xe flow rate ratio exceeds 0.2. Further, it is seen that when the total flow rate is 100 mTorr (13.33 Pa), the ion current density tends to almost monotonously increase.

Further, referring to FIG. 7(b), it is seen that as the Xe flow rate ratio increases, the electron temperature becomes smaller in the order of pressures of the mixed gases, which correspond to the total flow rates, of 20 mTorr (2.66 Pa), 40 mTorr (5.33 Pa), and 100 mTorr (13.33 Pa) and, as the Xe flow rate ratio increases from 0.2, the electron temperature for each flow rate monotonously decreases.

All the above data show that substantially the same results as those in the case of 100% are obtained when the Xe composition ratio is 20% or more, preferably 50% or more, even if it is not 100%. That is, it is seen that damage during the plasma processing can be reduced even by using inexpensive Ar at about 80%, preferably about 50%. As a result, according to this invention, it is possible to achieve a reduction in amount of use of expensive Kr and Xe gases.

Second Embodiment

Next, there is shown an example in which plasma processing according to this invention is applied to film formation. In the second embodiment, formation of a $SiO_2$ film by a CVD (Chemical Vapor Deposition) process is carried out as the film formation.

Figure 8:
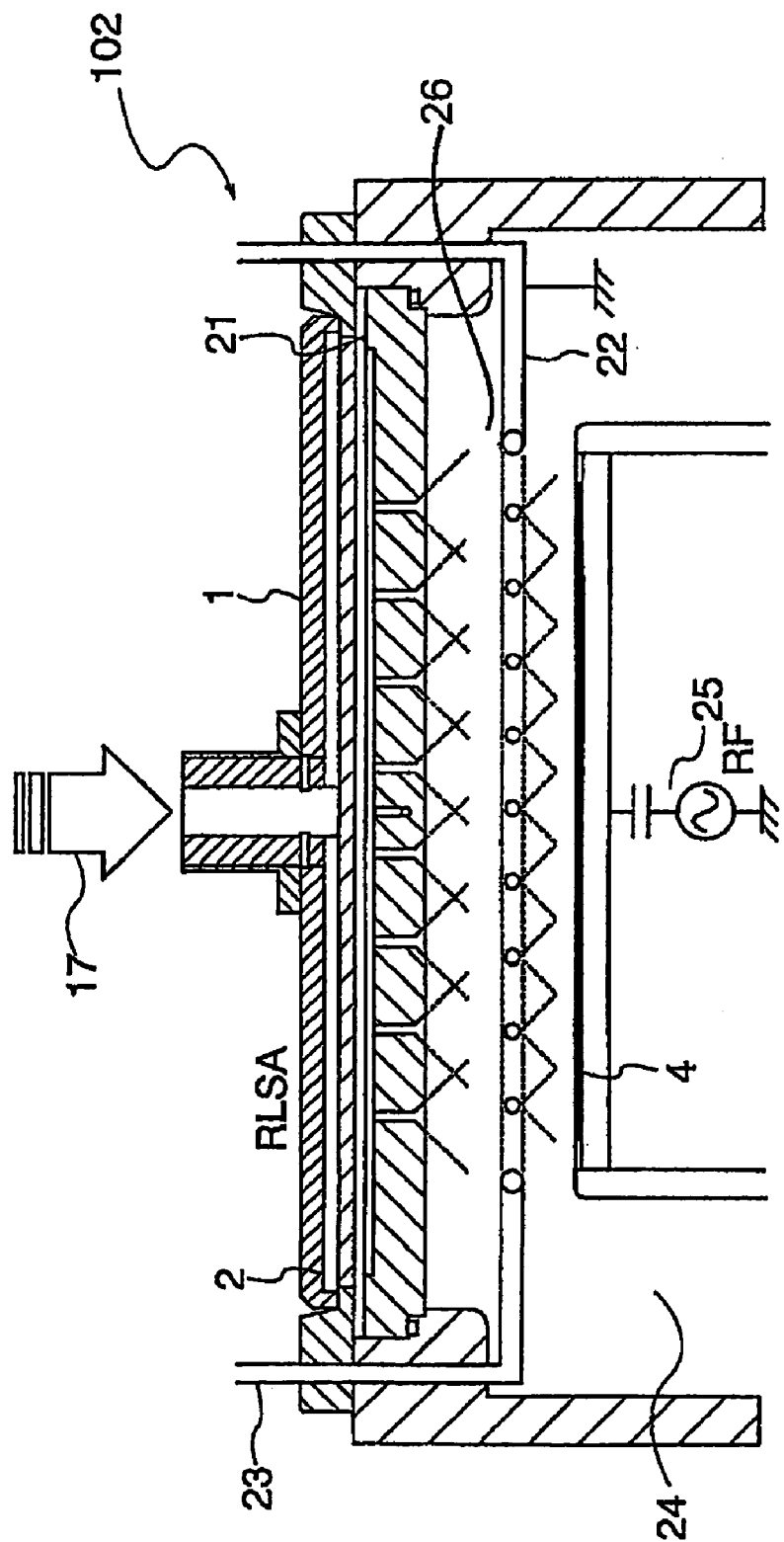
FIG. 8 is a sectional view of a dual shower plate microwave-excited plasma processing apparatus for use in embodiments 2 and 3 of this invention.

FIG. 8 is a schematic sectional view of a dual shower plate microwave-excited plasma processing apparatus for use in the second embodiment of this invention. The apparatus of FIG. 8 has a structure in which a lower shower plate 22 is disposed in the plasma diffusion region of the microwave-excited plasma processing apparatus shown in FIG. 1. Kr (or Xe) and Ar for plasma excitation and an $O_2$ gas are introduced from an upper shower plate 21. A $SiH_4$ gas being a reactive gas for film formation is introduced from the lower shower plate 22. A high-density plasma is excited in a space between the upper shower plate 21 and the lower shower plate 22 and the plasma diffuses onto the surface of a silicon wafer 4 through gaps of a lattice-shaped pipe (having many holes for ejecting the reactive gas) of the lower shower plate 22, so that a $SiO_2$ film is formed on the surface of the workpiece 4 by the reactive gas supplied thereto.

In this event, if a Kr (or Xe), Ar, and $NH_3$ (or $N_2/H_2$) mixed gas is supplied from the upper shower plate 21 and a $SiH_4$ gas is supplied from the lower shower plate 22, a $Si_3N_4$ film can be formed.

On the other hand, if Kr (or Xe) and Ar are supplied from the upper shower plate 21 and a CxFy ($C_5F_8$, $C_4F_8$, or the like) gas is supplied from the lower shower plate 22, a fluorocarbon film can be formed.

On the other hand, if Kr (or Xe) and Ar are supplied from the upper shower plate 21 and a $SiH_4$ gas is supplied from the lower shower plate 22, a silicon film can be formed.

Figure 7:
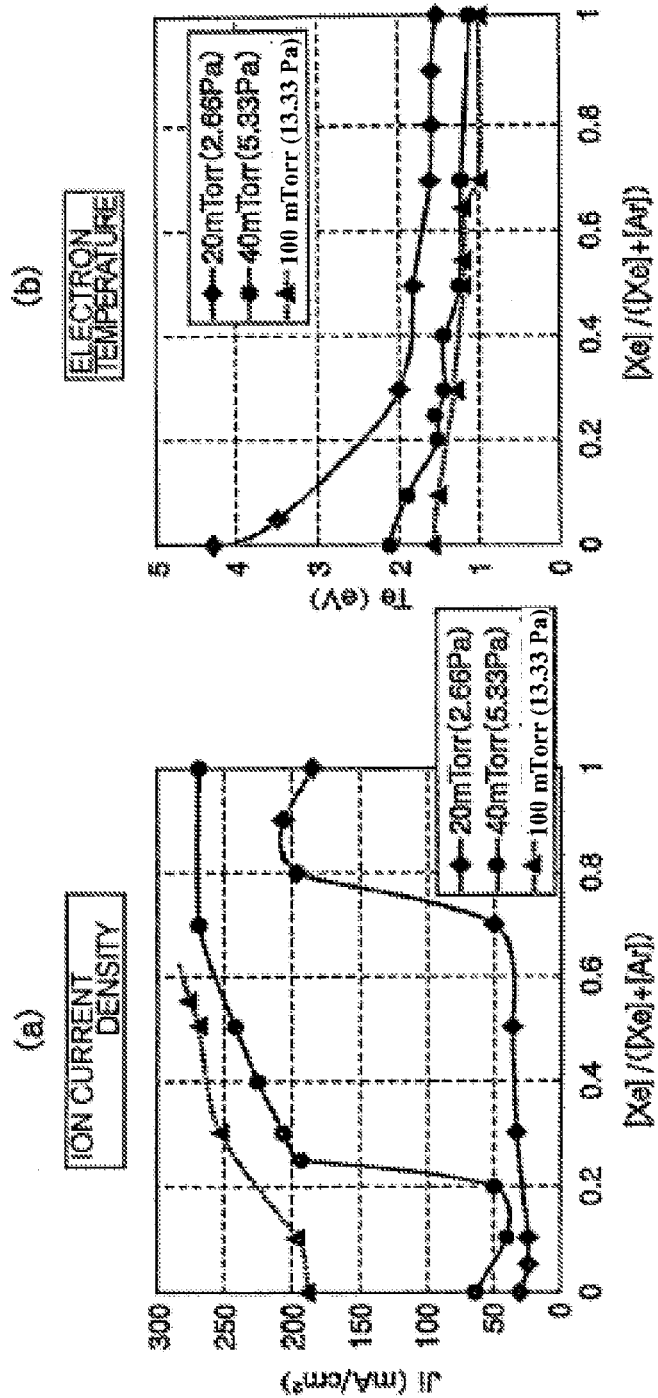
FIG. 7 includes a diagram (a) showing ion current densities when the pressure of a mixed gas is changed, and a diagram (b) showing electron temperatures when the pressure of a mixed gas is changed.

In any of the above cases, as is clear from FIGS. 2, 6, and 7, since the electron-collision cross-sectional area and the ionization energy of a Kr or Xe gas are both small where the electron temperature is low as compared with Ar, when a microwave is irradiated to a mixed gas of Ar and Kr (or Xe), Kr (Xe) is selectively ionized to form a plasma so that the electron temperature of the plasma is defined by Kr (Xe). Therefore, it is possible to suppress damage to various films during formation thereof or having been formed and to suppress the use of the expensive Kr (Xe) gas.

Third Embodiment

Next, there is shown an example in which plasma processing of this invention is applied to an etching process. Referring to FIG. 8, Kr (or Xe) and Ar gases for plasma excitation are introduced from the upper shower plate 21. A CxHy gas being a reactive gas is introduced from the lower shower plate 22. Herein, by applying a bias (RF) 25 to a substrate 4, a negative DC bias is applied to the side of the silicon wafer 4 so that $SiO_2$ present on the silicon substrate 4 is etched. An outline arrow indicated by symbol 17 denotes a microwave for plasma excitation and symbol 26 denotes a high-density plasma region.

Also in this event, as is clear from FIGS. 2, 6, and 7, since the electron-collision cross-sectional area and the ionization energy of a Kr or Xe gas are both small where the electron temperature is low as compared with Ar, when a microwave is irradiated to a mixed gas of Ar and Kr (or Xe), Kr (Xe) is selectively ionized to form a plasma so that the electron temperature of the plasma is defined by Kr (Xe). Therefore, it is possible to suppress damage to the surface of the silicon substrate 4 or a film formed on the silicon substrate during etching and to suppress the use of the expensive Kr (Xe) gas.

INDUSTRIAL APPLICABILITY

As described above, a plasma processing apparatus and a plasma processing method according to this invention are, of course, applicable to semiconductor manufacturing processes and are also applicable to the manufacture of electronic/electrical devices and the manufacture of various machine components.

The invention claimed is:

1. A plasma-processing method comprising:
generating a plasma by supplying gases for plasma excitation including a mixed gas of argon and at least one of xenon and krypton as a rare gas through an upper shower plate, said rare gas having a composition ratio of the at least one of xenon and krypton to the mixed gas of 20% or more by volume for plasma excitation; and
supplying a reactive gas from a lower shower plate for processing a workpiece by the use of said plasma,
wherein
a pressure of the mixed gas is controlled to be 2.66 to 5.33 Pa, and
said processing includes one selected from the group consisting of:
(a) oxidizing of at least a portion of a surface of said workpiece;
(b) nitriding of at least a portion of a surface of said workpiece;
(c) oxynitriding of at least a portion of a surface of said workpiece; and
(d) film forming on at least a portion of a surface of said workpiece.

2. A plasma processing method according to claim 1, wherein said processing includes one selected from the steps (a) to (c) and includes introducing a nitriding gas or an oxidizing gas into said plasma.

3. The method according to claim 1, wherein said processing includes the step (d) and includes introducing a gas necessary to film forming into said plasma.

4. The method according to claim 3, wherein said film forming includes forming an insulating film.

5. The method according to claim 1, further comprising recovering a part or the whole of said rare gas for reuse.

6. A method of manufacturing an electronic device, comprising a step of processing a workpiece by the plasma processing method according to claim 1.

7. A plasma processing method comprising generating a plasma by supplying gases for plasma excitation including a mixed gas of argon and at least one of xenon and krypton as a rare gas through an upper shower plate, said rare gas having a composition ratio of the at least one of xenon and krypton to the mixed gas of 20% or more by volume for plasma excitation and a pressure of the mixed gas of 2.66 to 5.33 Pa; and supplying a reactive gas from a lower shower plate for processing a workpiece by the use of said plasma, wherein said processing includes the step (e) etching of at least a portion of a surface of said workpiece.

8. The method according to claim 7, wherein the step (e) includes introducing a gas necessary for etching into said plasma and etching a selected portion or the whole of a surface of said workpiece.

* * * * *